US009449925B2

(12) United States Patent
Lin et al.

(10) Patent No.: US 9,449,925 B2
(45) Date of Patent: Sep. 20, 2016

(54) INTEGRATED PASSIVE DEVICES

(71) Applicant: STATS ChipPAC, Ltd., Singapore (SG)

(72) Inventors: Yaojian Lin, Singapore (SG); Haijing Cao, Singapore (SG); Qing Zhang, Singapore (SG); Kang Chen, Singapore (SG); Jianmin Fang, Shanghai (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 50 days.

(21) Appl. No.: 13/782,939

(22) Filed: Mar. 1, 2013

(65) Prior Publication Data
US 2013/0175668 A1    Jul. 11, 2013

Related U.S. Application Data

(60) Division of application No. 11/949,255, filed on Dec. 3, 2007, now Pat. No. 8,409,970, which is a continuation-in-part of application No. 11/553,949, filed on Oct. 27, 2006, now Pat. No. 8,669,637.

(60) Provisional application No. 60/596,926, filed on Oct. 29, 2005.

(51) Int. Cl.
*H01L 29/00* (2006.01)
*H01L 23/538* (2006.01)
(Continued)

(52) U.S. Cl.
CPC ....... *H01L 23/5389* (2013.01); *H01L 21/6835* (2013.01); *H01L 23/49822* (2013.01);
(Continued)

(58) Field of Classification Search
CPC .............. H01L 24/48; H01L 27/1266; H01L 23/5389; H01L 28/10; H01L 28/40; H01L 24/05; H01L 23/5223; H01L 27/016; H01L 29/78603

USPC ........ 257/E27.111, 531, 528, 532, 700, 777, 257/737, 784, 277, 359, 778, 783
See application file for complete search history.

(56) References Cited

U.S. PATENT DOCUMENTS 4,604,799 A    8/1986    Gurol
5,250,843 A    10/1993   Eichelberger
(Continued)

FOREIGN PATENT DOCUMENTS

JP         6140737 A        5/1994
JP       2003282614 A      10/2003
KR    10-2002-0086741 A   11/2002

OTHER PUBLICATIONS

Liu, Kai et al., "Small Form-Factor Integrated Passive Devices for SiP Applications", Microwave Symposium, 2007., IEEE/MTT-S International, Jun. 3-8, 2007, pp. 2117-2120.

*Primary Examiner* — Shouxiang Hu
(74) *Attorney, Agent, or Firm* — Robert D. Atkins; Atkins and Associates, P.C.

(57) ABSTRACT

A semiconductor device has integrated passive circuit elements. A first substrate is formed on a backside of the semiconductor device. The passive circuit element is formed over the insulating layer. The passive circuit element can be an inductor, capacitor, or resistor. A passivation layer is formed over the passive circuit element. A carrier is attached to the passivation layer. The first substrate is removed. A non-silicon substrate is formed over the insulating layer on the backside of the semiconductor device. The non-silicon substrate is made with glass, molding compound, epoxy, polymer, or polymer composite. An adhesive layer is formed between the non-silicon substrate and insulating layer. A via is formed between the insulating layer and first passivation layer. The carrier is removed. An under bump metallization is formed over the passivation layer in electrical contact with the passive circuit element. A solder bump is formed on the under bump metallization.

18 Claims, 6 Drawing Sheets

(51) Int. Cl.
  *H01L 23/00* (2006.01)
  *H01L 27/12* (2006.01)
  *H01L 49/02* (2006.01)
  *H01L 21/683* (2006.01)
  *H01L 23/498* (2006.01)
  *H01L 23/50* (2006.01)

(52) U.S. Cl.
  CPC ........... *H01L24/48* (2013.01); *H01L 27/1266* (2013.01); *H01L 28/00* (2013.01); *H01L 28/10* (2013.01); *H01L 28/20* (2013.01); *H01L 28/40* (2013.01); *H01L 23/50* (2013.01); *H01L 24/16* (2013.01); *H01L 2221/68345* (2013.01); *H01L 2224/16* (2013.01); *H01L 2924/01004* (2013.01); *H01L 2924/01019* (2013.01); *H01L 2924/01078* (2013.01); *H01L 2924/01079* (2013.01); *H01L 2924/04941* (2013.01); *H01L 2924/14* (2013.01); *H01L 2924/19041* (2013.01); *H01L 2924/30105* (2013.01)

(56) References Cited

U.S. PATENT DOCUMENTS

| | | |
|---|---|---|
| 5,353,498 A | 10/1994 | Fillion et al. |
| 5,370,766 A | 12/1994 | Desaigoudar et al. |
| 5,446,311 A | 8/1995 | Ewen et al. |
| 5,478,773 A | 12/1995 | Dow et al. |
| 5,514,613 A | 5/1996 | Santadrea et al. |
| 5,525,546 A | 6/1996 | Harada et al. |
| 5,813,664 A | 9/1998 | Pan |
| 5,841,193 A | 11/1998 | Eichelberger |
| 5,866,952 A | 2/1999 | Wojnarowski et al. |
| 5,877,078 A * | 3/1999 | Yanagida ............. 438/612 |
| 5,930,598 A | 7/1999 | Wille et al. |
| 6,036,809 A | 3/2000 | Kelly et al. |
| 6,075,427 A | 6/2000 | Tai et al. |
| 6,100,574 A | 8/2000 | Norstrom et al. |
| 6,168,965 B1 | 1/2001 | Malinovich et al. |
| 6,180,445 B1 | 1/2001 | Tsai |
| 6,218,015 B1 | 4/2001 | Allen et al. |
| 6,284,617 B1 | 9/2001 | Erdeljac et al. |
| 6,294,420 B1 | 9/2001 | Tsu et al. |
| 6,444,920 B1 | 9/2002 | Klee et al. |
| 6,534,374 B2 | 3/2003 | Johnson et al. |
| 6,545,225 B2 | 4/2003 | Copetti et al. |
| 6,636,139 B2 | 10/2003 | Tsai et al. |
| 6,657,707 B1 * | 12/2003 | Morken et al. ............ 356/36 |
| 6,713,835 B1 * | 3/2004 | Horak et al. ............ 257/522 |
| 6,730,573 B1 | 5/2004 | Ng et al. |
| 6,761,963 B2 | 7/2004 | Casper et al. |
| 6,800,534 B2 | 10/2004 | Hsieh |
| 6,876,056 B2 | 4/2005 | Tilmans et al. |
| 6,900,708 B2 | 5/2005 | White et al. |
| 6,902,981 B2 | 6/2005 | Ng et al. |
| 6,933,585 B2 | 8/2005 | Brissot et al. |
| 6,933,614 B2 | 8/2005 | Lee et al. |
| 7,068,139 B2 | 6/2006 | Harris et al. |
| 7,084,515 B2 | 8/2006 | Fuller et al. |
| 7,202,567 B2 | 4/2007 | Kikuta et al. |
| 7,220,667 B2 | 5/2007 | Yamagata |
| 7,230,316 B2 | 6/2007 | Yamazaki et al. |
| 7,619,901 B2 | 11/2009 | Eichelberger et al. |
| 7,749,814 B2 | 7/2010 | Lin et al. |
| 7,790,503 B2 | 9/2010 | Lin et al. |
| 8,158,510 B2 | 4/2012 | Lin et al. |
| 8,409,970 B2 | 4/2013 | Lin et al. |
| 2002/0025585 A1 | 2/2002 | Lam et al. |
| 2002/0111011 A1 * | 8/2002 | Wu et al. ............ 438/618 |
| 2002/0123159 A1 | 9/2002 | Chi et al. |
| 2002/0180026 A1 | 12/2002 | Liu et al. |
| 2003/0162386 A1 | 8/2003 | Ogawa et al. |
| 2003/0219956 A1 | 11/2003 | Mori et al. |
| 2004/0007778 A1 | 1/2004 | Shinozaki et al. |
| 2004/0041243 A1 | 3/2004 | Ogawa |
| 2004/0147064 A1 | 7/2004 | He |
| 2004/0171190 A1 | 9/2004 | Nishitani et al. |
| 2004/0195572 A1 | 10/2004 | Kato et al. |
| 2005/0017342 A1 | 1/2005 | Morrison |
| 2005/0017346 A1 * | 1/2005 | Yamagata ............ 257/701 |
| 2005/0017361 A1 | 1/2005 | Lin et al. |
| 2005/0051870 A1 | 3/2005 | Yamazaki et al. |
| 2005/0054155 A1 | 3/2005 | Song et al. |
| 2005/0127393 A1 | 6/2005 | Kurokawa |
| 2005/0212106 A1 | 9/2005 | Kwon et al. |
| 2005/0253255 A1 | 11/2005 | Degani et al. |
| 2005/0253257 A1 | 11/2005 | Chiu et al. |
| 2006/0291029 A1 | 12/2006 | Lin et al. |
| 2007/0010064 A1 | 1/2007 | Das et al. |
| 2007/0025092 A1 | 2/2007 | Lee et al. |
| 2007/0114634 A1 | 5/2007 | Lin et al. |
| 2007/0114651 A1 | 5/2007 | Marimuthu et al. |
| 2007/0231251 A1 | 10/2007 | Itsuki et al. |
| 2007/0235878 A1 | 10/2007 | Lin et al. |
| 2007/0289127 A1 | 12/2007 | Hurwitz et al. |
| 2009/0072388 A1 | 3/2009 | Tews et al. |
| 2009/0072411 A1 | 3/2009 | Tews et al. |
| 2009/0315142 A1 | 12/2009 | Burke et al. |

* cited by examiner

INTEGRATED PASSIVE DEVICES

CLAIM TO DOMESTIC PRIORITY

The present application is a division of U.S. application Ser. No. 11/949,255, now U.S. Pat. No. 8,409,970, filed Dec. 3, 2007, which is a continuation-in-part of application Ser. No. 11/553,949, filed Oct. 27, 2006, which claims the benefit of provisional application 60/596,926, filed Oct. 29, 2005.

FIELD OF THE INVENTION

The present invention relates in general to semiconductor devices and, more particularly, to a semiconductor device and method of making integrated passive devices.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, e.g., inductors, capacitors, and resistors, on the semiconductor die. Most silicon substrate-based wafers for high Q radio frequency (RF) applications as used in a final product are high-cost items in the manufacturing process. The silicon substrate for high Q RF applications is also known to have high resistivity. It is desirable to eliminate the silicon substrate of high resistivity in semiconductor devices containing passive circuit elements to save manufacturing costs, while maintaining silicon substrate processes.

SUMMARY OF THE INVENTION

In one embodiment, the present invention is a semiconductor device comprising a first substrate and integrated passive device disposed over the first substrate. A first insulating layer is disposed over the integrated passive device and first substrate. A conductive layer is formed over the first insulating layer. A second insulating layer is formed over the first insulating layer and conductive layer. A second substrate is disposed over the second insulating layer.

In another embodiment, the present invention is a semiconductor device comprising a first substrate and integrated passive device disposed over the first substrate. A first insulating layer is disposed over the integrated passive device and first substrate. An interconnect structure is formed over the first insulating layer. A second substrate is disposed over the interconnect structure.

In another embodiment, the present invention is a semiconductor device comprising a non-silicon substrate and integrated passive device disposed over the non-silicon substrate. A first insulating layer is disposed over the integrated passive device and non-silicon substrate. A conductive layer is formed over the first insulating layer. A second insulating layer is formed over the first insulating layer and conductive layer.

In another embodiment, the present invention is a semiconductor device comprising a non-silicon substrate and integrated passive device disposed over the non-silicon substrate. A first insulating layer is disposed over the integrated passive device and non-silicon substrate. An interconnect structure is formed over the first insulating layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition (CVD), physical vapor deposition (PVD), evaporation, and sputtering. Photolithography involves the masking of areas of the surface and etching away undesired material to form specific structures. The doping process injects concentrations of dopant material by thermal diffusion or ion implantation.

Figure 1:
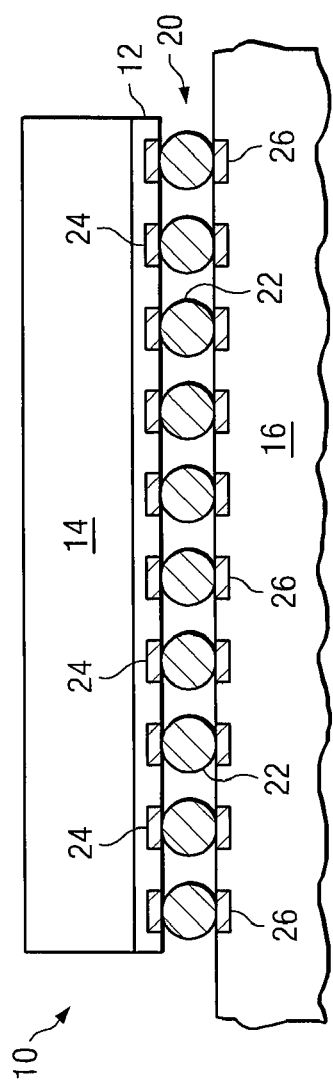
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
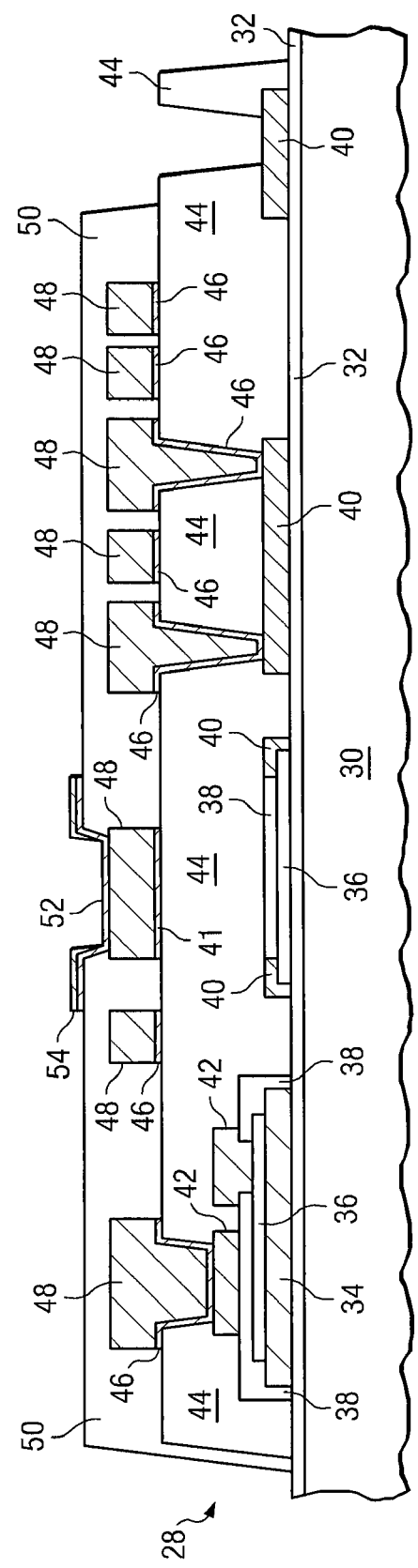
FIGS. 2a-2e illustrate a process of forming integrated passive devices (IPD) on a wafer.

FIGS. 2a-2e illustrates a process of forming a semiconductor device including integrated passive circuit devices (IPD) on semiconductor wafer 28. In FIG. 2a, a low cost dummy substrate 30 is provided which is made with silicon (Si) dummy wafer material. An insulating layer 32 is deposited on substrate 30. The insulating layer 32 is made with silicon nitride (SixNy), silicon dioxide (SiO2), silicon oxynitride (SiON), tantalum pentoxide (Ta2O5), zircon (ZrO2), aluminum oxide (Al2O3) or other material having dielectric insulation properties. The deposition of insulating layer 32 may involve PVD, CVD, printing and sintering with thicknesses ranging from about 500 Å to 50 µm. In an alternative embodiment, insulating layer 32 has a thickness ranging from 1000 Å to 5000 Å.

An electrically conductive layer 34 is formed on insulating layer 32 using a patterning and deposition process. Conductive layer 34 can be made with aluminum (Al), aluminum alloy, copper (Cu), tin (Sn), nickel (Ni), gold (Au), silver (Ag), or other electrically conductive material with optional adhesion and barrier layers underneath or sandwiching the main body of insulating layer 32. The adhesion and barrier layers can be titanium (Ti), titanium tungsten (TiW), titanium nitride (TiN), tantalum (Ta), or tantalum nitride (TaN). The deposition of conductive layer 34 uses PVD, CVD, electrolytic plating or electroless plating processes.

A resistive layer 36 is patterned and deposited on conductive layer 34 and insulating layer 32. Resistive layer 36 is made with tantalum silicide (TaSi2) or other metal silicides, TaN, nichrome (NiCr), TiN, or doped poly-silicon having a resistivity of about 5 to 100 ohm/sq. In an alternative embodiment, resistive layer 36 has a resistivity of 7 to 10 ohm/sq. The deposition of resistive layer 36 may involve PVD or CVD with thicknesses matching designed surface resistivity (Rs).

An insulating layer 38 is formed over and around resistive layer 36 using a patterning and deposition process. The portion of insulating layer 38 over conductive layer 34 is formed so as to provide an opening to expose resistive layer 36 as shown, for interconnection. The insulating layer 38 is made with SixNy, SiO2, SiON, Ta2O5, ZnO, ZrO2, Al2O3, or other material having dielectric insulation properties. The deposition of insulating layer 38 may involve PVD, or CVD with a thickness of about 100 Å to 4000Å.

An electrically conductive layer 40 is patterned and deposited over insulating layer 32 and resistive layer 36. Electrically conductive layer 42, and a portion of conductive layer 40, is patterned and deposited over insulating layer 38 and resistive layer 36 through the opening in insulating layer 38. The individual portions of conductive layers 40 and 42 can be electrically common or electrically isolated depending on the connectivity of the individual devices formed on substrate 30. Conductive layers 40 and 42 can be made with Al, Cu, or other electrically conductive material with optional conductive adhesion and barrier layers. The deposition of conductive layers 40 and 42 uses a PVD, CVD, electrolytic plating or electroless plating process.

A passivation layer 44 is formed over the structure described above for structural support and physical and electrical isolation. Passivation layer 44 is chosen to have good selectivity to a silicon etchant so it can be used as an etching stop layer. Passivation layer 44 can be made with one or more layers of SixNy, Si3N4, SiN, SiO2, SiON, polyimide (PI), benzocyclobutene (BCB), polybenzoxazole (PBO), or other insulating material. A portion of passivation layer 44 is removed using a mask-defined etching process to expose conductive layers 40 and 42.

Electrically conductive layers 46 and 48 are formed by patterning and deposition as shown. Layer 46 acts as the adhesion and barrier layer for conductive layer 48. The individual portions of conductive layers 46 and 48 can be electrically common or electrically isolated depending on the connectivity of the individual devices formed on substrate 30. For example, one portion of conductive layer 46 contacts conductive layer 40, while another portion of conductive layer 46 contacts conductive layer 42, which is electrically isolated from conductive layer 40. Conductive layers 46 may include Ti, TiW, chromium (Cr), Ta, or TaN, or other electrically conductive material. Conductive layer 48 can be made with Al, Cu, or other electrically conductive material. The deposition of conductive layers 46 and 48 uses a PVD, CVD, electrolytic plating or electroless plating process.

A passivation layer 50 is formed over passivation layer 44 and conductive layer 48 for structural support and physical and electrical isolation. Passivation layer 50 can be made with SixNy, SiO2, SiON, PI, BCB, PBO, or other insulating material. A portion of passivation layer 50 is removed using a mask-defined etching process to expose conductive layer 48, which is later used in the formation of the solder bump.

An electrically conductive adhesive layer 52 is deposited on conductive layer 48. Adhesive layer 52 can be made with Ti, TiW, Cr, Ni, or Ta. Next, electrically conductive layer 54 is deposited on adhesive layer 52. Conductive layer 54 can be made with Al, Cu, Sn, Ni, Au, Ag, or other electrically conductive material. Alternately, conductive layer 54 may contain multiple layers including a barrier layer and wetting layer. The barrier layer can be Ni, nickel vanadium (NiV), chromium copper (CrCu), TiW, and TaN. The wetting layer can be Cu, Au, or Ag.

Conductive layers 52 and 54 constitute an under bump metallization (UBM) structure for the solder bump. The deposition of conductive layers 52 and 54 uses a PVD, CVD, electrolytic plating or electroless plating process followed by etching. The UBM etchant can vary depending on specific UBM structure. For example, the etchant for Cu is A70 with 11.15% nitric acid and 6.3% acetic acid. The etchant can be A75 with 75.74% phosphoric acid and 7.35% acetic acid. The etchant for Ti can be 1% buffered hydrofluoric acid (HF).

The right-most conductive layer 40 can be used for a wire bond pad. Conductive layers 52 and 54 may cover the wire bond pad for a good electrical connection.

Figure 2B:
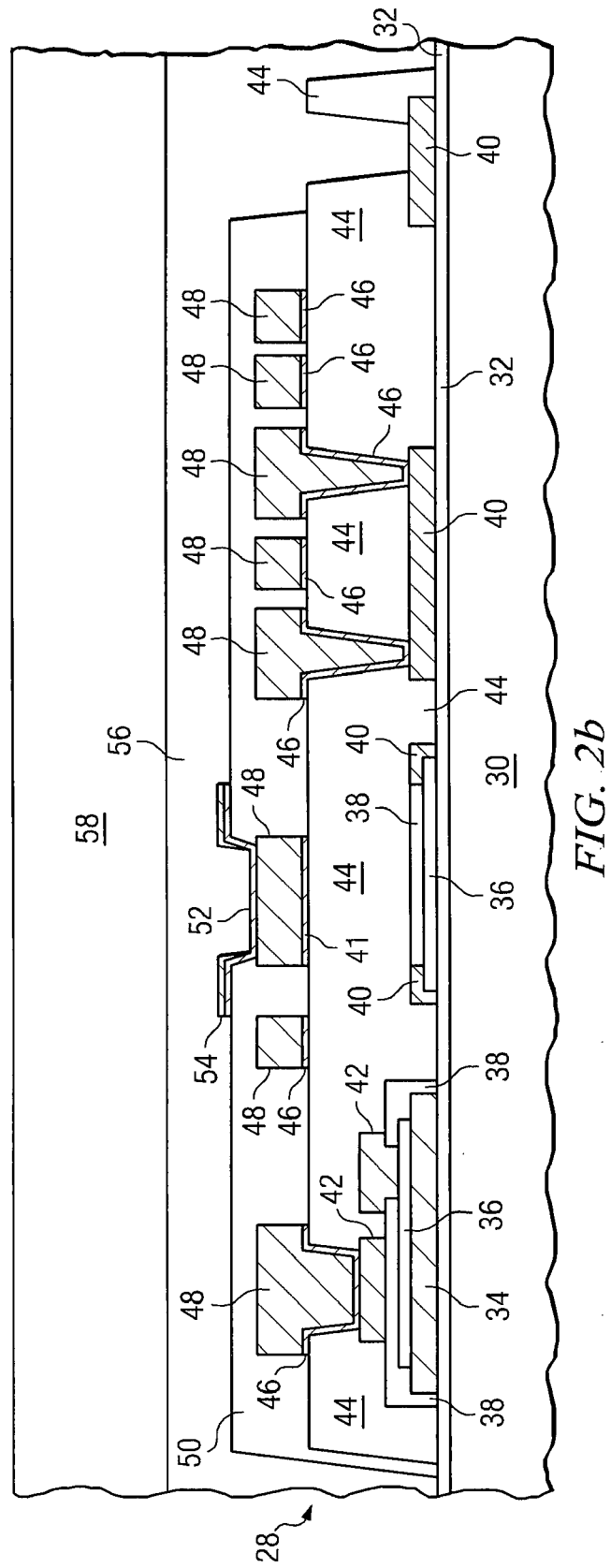

In FIG. 2b, adhesive layer 56 is deposited over the structure formed in FIG. 2a. A temporary wafer carrier 58 is bonded to adhesive layer 56 on a front side of wafer 28 for handling and to support the individual semiconductor die without substrate 30. The carrier 58 can be glass, metal, or other rigid material. The adhesive layer 56 can be activated and cured with ultraviolet (UV) light or heat.

Figure 2C:
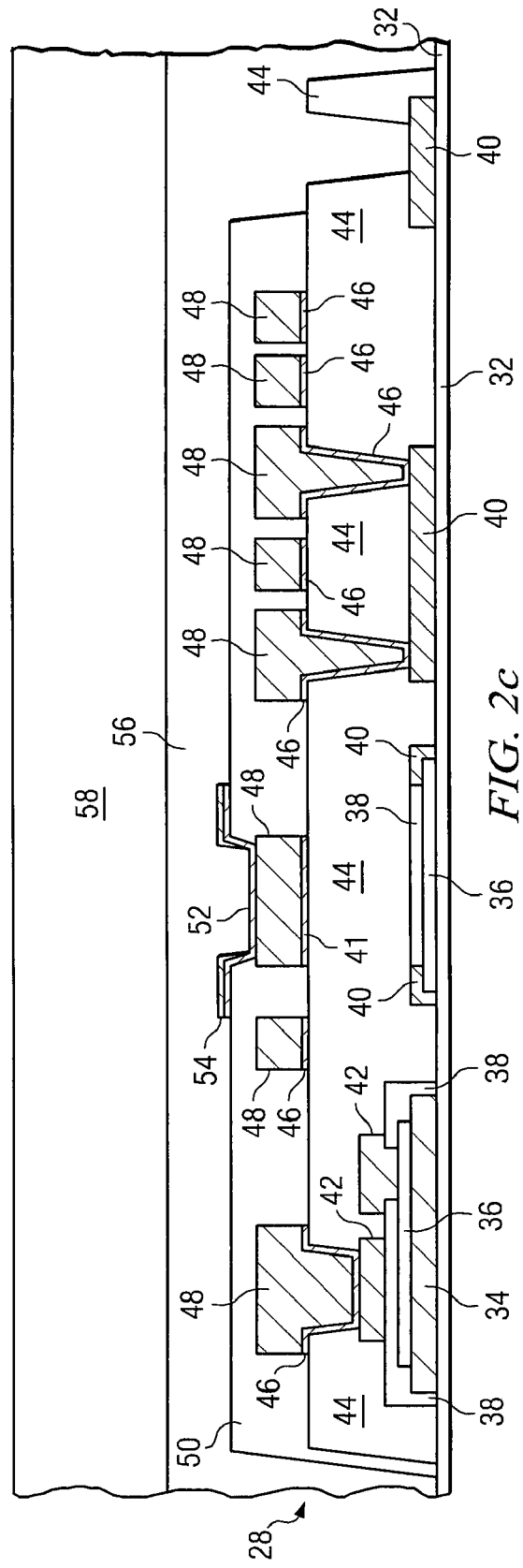

In FIG. 2c, dummy substrate 30 is removed by back grinding, silicon wet etching, plasma etching, or chemical mechanical polishing (CMP). In one embodiment, the silicon wet etchant can be 0.5-10% HF and 0.5-10% hydrogen peroxide (H2O2). After removing dummy substrate 30, additional step cutting or trench may be performed on the saw street with standard dicing or wafer process to reduce potential warpage of semiconductor wafer 28 after molding or lamination.

Figure 2D:
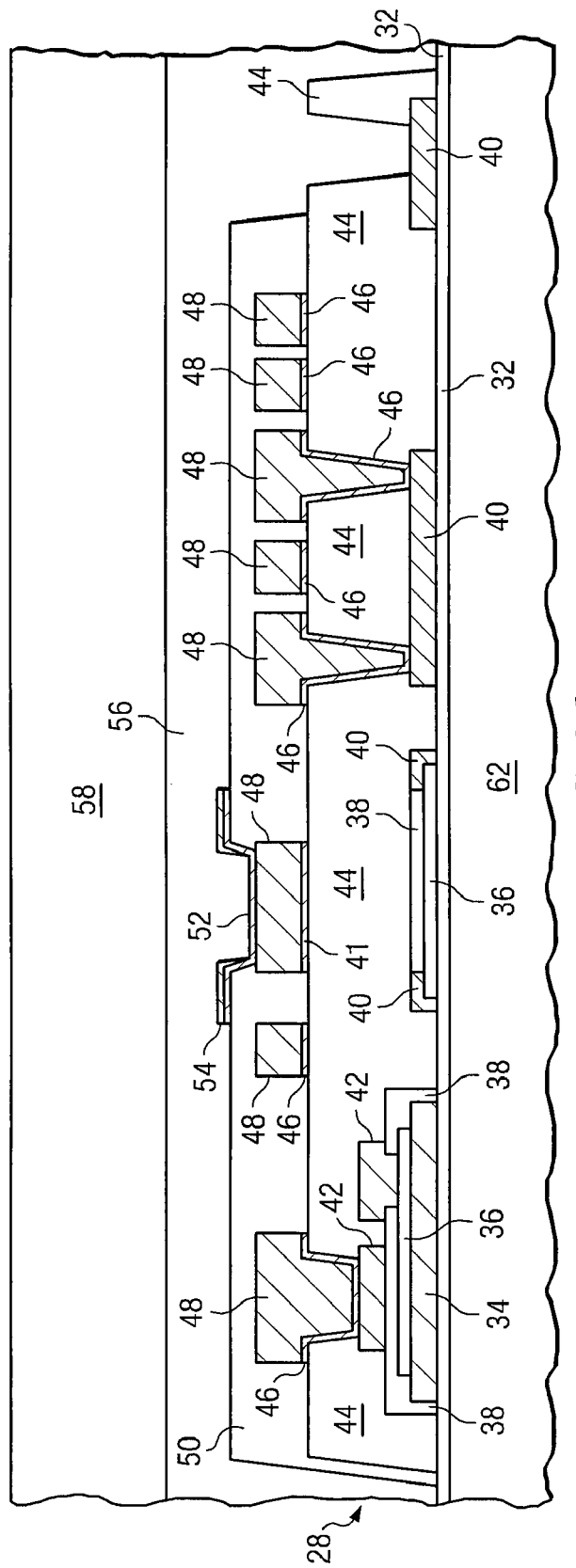

In FIG. 2d, non-silicon substrate 62 having a high resistivity of approximately 1000 ohm-cm is formed on the backside of wafer 28 after plasma cleaning or proper wet cleaning by bonding the substrate to insulating layer 32. Substrate 62 is made of a non-silicon material such as glass, glass fiber reinforced epoxy composite, molding compound, and other polymer matrix composite with high resistivity and proper loss tangent. For example, EMC G770 with K value of 3.7 has a loss tangent 0.009 up to 15 GHz, and volume resistivity $1e^{12}$ ohm-cm. Alternatively, MSL-BE-67G(H) has a loss tangent 0.01 at 2 GHz and volume resistivity $1e^{15}$ ohm-cm. In another embodiment, substrate 62 is coated, printed, molded, or laminated on insulating layer 32 and then cured. Saw streets with taper may be applied in the molding process.

Figure 2E:
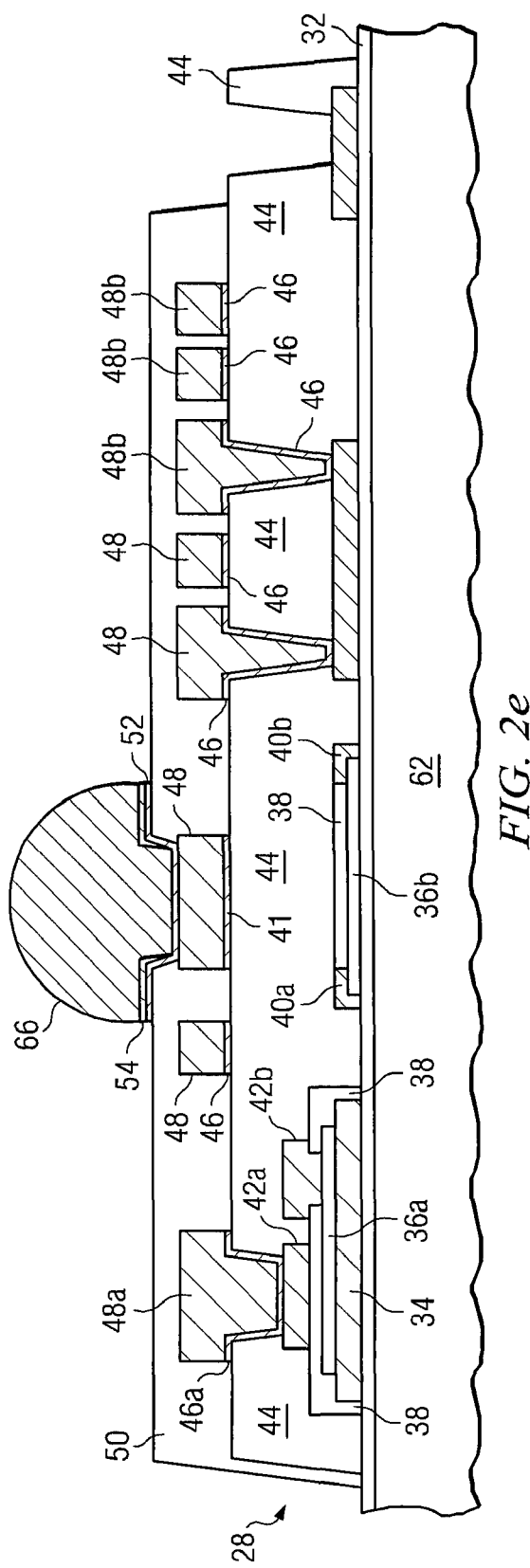

In FIG. 2e, adhesive layer 56 and carrier 58 are removed either before or after wafer singulation. An electrically conductive solder material is deposited over conductive layers 52 and 54 through a solder paste printing, solder ball attaching, electrolytic plating or electroless plating process. The solder material can be any metal or electrically conductive material, e.g., Sn, lead (Pb), Ni, Au, Ag, Cu, bismuthinite (Bi) and alloys thereof, or mixtures of other electrically conductive material. In one embodiment, the solder material is 63 percent weight of Sn and 37 percent weight of Pb. The solder material is reflowed by heating the conductive material above its melting point to form spherical ball or bump 66. In one embodiment, solder bump 66 is about 75 μm in height. In some applications, solder bump 66 is reflowed a second time to improve electrical contact to the UBM structure. A plurality of solder bumps like 66 is formed on the semiconductor device.

Figure 3:
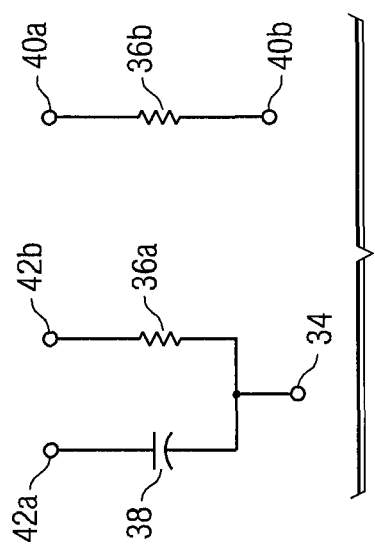
FIG. 3 is an equivalent electrical circuit of the IPDs.

The combination of conductive layer 34, insulating layer 38, and conductive layers 42a, 46a, and 48a constitute an integrated passive device (IPD) having capacitive properties, i.e., a metal-insulator-metal (MIM) capacitor. Resistive layers 36a and 36b provide resistor elements to the passive circuit. The equivalent circuit schematic is shown in FIG. 3. MIM capacitor 38 includes the conductive layers defining nodes 34 and 42a. Resistor 36a is provided between nodes 34 and 42b. Resistor 36b is provided between nodes 40a and 40b. The conductive layer 48b is an inductor on semiconductor wafer 28. The conductive layer is typically wound or coiled in plan view on the surface of substrate 62 to produce or exhibit the desired inductive properties, as shown by the three regions 48b in the cross-sectional view of FIG. 2e. The passive circuit elements are electrically connected to one or more of the solder bumps 66 through conductive layer 48. The above IPDs can perform one or more electrical functions such as a filter, balun, or diplexer.

Figure 4:
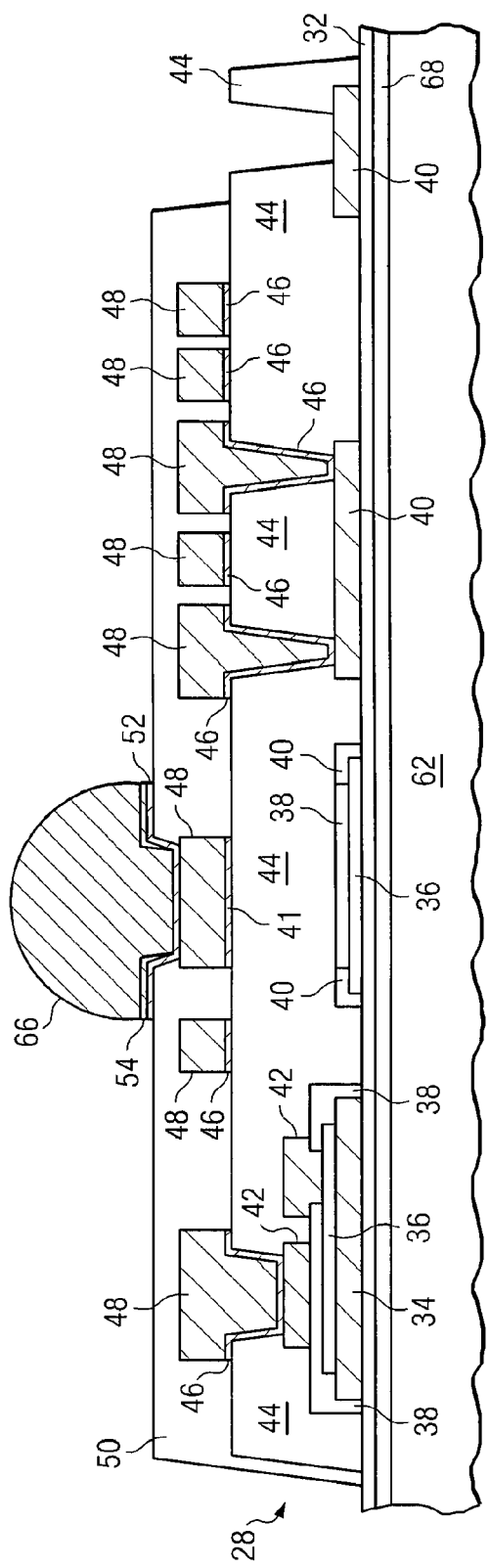
FIG. 4 illustrates an adhesive layer between the non-silicon substrate and IPDs.

FIG. 4 illustrates an embodiment with an adhesive layer 68 formed between non-silicon substrate 62 and the IPDs. Adhesive layer 68 can be made with epoxy based or mixed resin adhesives.

Figure 5:
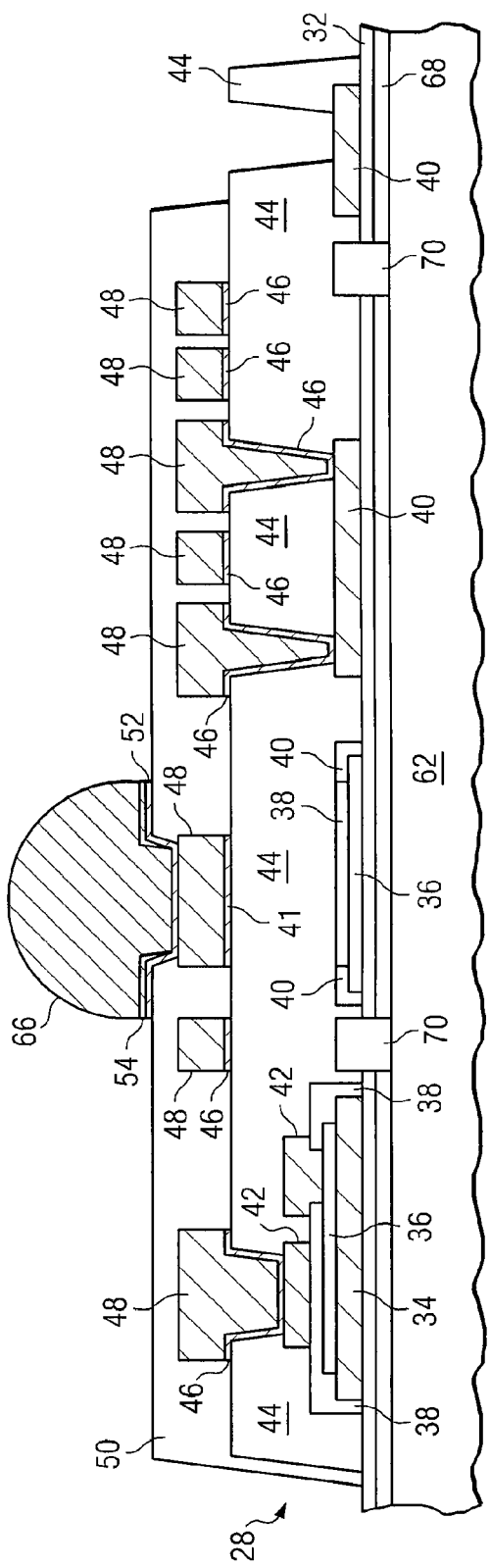
FIG. 5 illustrates vias formed between the non-silicon substrate and passivation layer around the IPDs.

FIG. 5 illustrates a via or trench 70 made in passivation layer 44 and insulating layer 32 to enhance the structural integrity between substrate 62 and IPD structure. Vias 70 can be filled with the same material as substrate 62 or adhesive 68.

In summary, the IPDs have been formed using a low cost sacrificial substrate 30. A temporary carrier holds the semiconductor die together until the non-silicon substrate 62 is formed on the backside of the wafer. The non-silicon substrate is a low cost alternative to silicon such as a polymer matrix composite film, glass, or molding compound. The above process involving the non-silicon substrate replaces the use of a high cost silicon wafer having high resistivity as commonly used in the prior art.

While one or more embodiments of the present invention have been illustrated in detail, the skilled artisan will appreciate that modifications and adaptations to those embodiments may be made without departing from the scope of the present invention as set forth in the following claims.

What is claimed:

1. An intermediate structure for a semiconductor device, comprising:
    a first substrate;
    a first insulating layer formed over the substrate including a first trench;
    an integrated passive device disposed over the first insulating layer;
    a second insulating layer disposed over the integrated passive device and first substrate including a second trench aligned with the first trench;
    a conductive layer formed over the second insulating layer;
    a third insulating layer formed over the second insulating layer and conductive layer;
    an insulating material disposed continuously in the first trench and the second trench with the first trench and second trench being devoid of conductive material;
    a second substrate disposed over the third insulating layer; and
    a non-conductive adhesive layer disposed between the third insulating layer and the second substrate.

2. The intermediate structure for the semiconductor device of claim 1, wherein the first substrate includes silicon material.

3. The intermediate structure for the semiconductor device of claim 1, wherein the first substrate includes non-silicon material.

4. The intermediate structure for the semiconductor device of claim 1, wherein the first substrate is made with a material selected from the group consisting of glass, molding compound, epoxy, polymer, and polymer composite.

5. The intermediate structure for the semiconductor device of claim 1, wherein a portion of the conductive layer is wound to exhibit an inductive property.

6. The intermediate structure for the semiconductor device of claim 1, wherein the integrated passive device includes a capacitor or resistor.

7. An intermediate structure for a semiconductor device, comprising:
   a first substrate;
   an integrated passive device disposed over the first substrate;
   a first insulating layer disposed over the integrated passive device and first substrate, the first insulating layer including a first trench;
   a second insulating layer disposed between the first insulating layer and first substrate, the second insulating layer including a second trench aligned with the first trench, the first trench and second trench being devoid of conductive material;
   an interconnect structure formed over the first insulating layer;
   an adhesive layer including resin deposited over the interconnect structure; and
   a second substrate disposed over the adhesive layer.

8. The intermediate structure for the semiconductor device of claim 7, wherein the first substrate includes silicon material.

9. The intermediate structure for the semiconductor device of claim 7, wherein the first substrate includes non-silicon material.

10. The intermediate structure for the semiconductor device of claim 7, wherein the first substrate is made with a material selected from the group consisting of glass, molding compound, epoxy, polymer, and polymer composite.

11. The intermediate structure for the semiconductor device of claim 7, wherein the interconnect structure includes:
   a conductive layer formed over the first insulating layer; and
   a second insulating layer formed over the first insulating layer and conductive layer.

12. The intermediate structure for the semiconductor device of claim 11, wherein a portion of the conductive layer is wound to exhibit an inductive property.

13. The intermediate structure for the semiconductor device of claim 7, further including:
   a via formed in the first insulating layer; and
   an insulating material disposed in the via.

14. An intermediate structure for a semiconductor device, comprising:
   a non-silicon substrate including a material;
   a first insulating layer formed over the non-silicon substrate including a trench in the first insulating layer, the trench filled entirely with a material same as the material of the non-silicon substrate;
   an integrated passive device disposed over the first insulating layer;
   a second insulating layer disposed over the integrated passive device and non-silicon substrate;
   a conductive layer formed over the second insulating layer;
   a third insulating layer formed over the first insulating layer and conductive layer; and
   an adhesive layer completely covering a surface of the third insulating layer.

15. The intermediate structure for the semiconductor device of claim 14, wherein the material of the non-silicon substrate is selected from the group consisting of glass, molding compound, epoxy, polymer, and polymer composite.

16. The intermediate structure for the semiconductor device of claim 14, wherein the material of the non-silicon substrate includes a resistivity of approximately 1000 ohm-cm.

17. The intermediate structure for the semiconductor device of claim 14, wherein a portion of the conductive layer is wound to exhibit an inductive property.

18. The intermediate structure for the semiconductor device of claim 14, wherein the integrated passive device includes a capacitor or resistor.

* * * * *